United States Patent [19]
Adachi et al.

[11] Patent Number: 5,600,151
[45] Date of Patent: Feb. 4, 1997

[54] SEMICONDUCTOR DEVICE COMPRISING A SEMICONDUCTOR SUBSTRATE, AN ELEMENT FORMED THEREON, AND A STRESS-BUFFERING FILM MADE OF A SILICONE LADDER RESIN

[75] Inventors: Etsushi Adachi; Hisoshi Adachi; Shigeyuki Yamamoto; Hiroyuki Nishimura; Shintaro Minami; Tooru Tazima; Hiroshi Tobimatsu, all of Hyogo, Japan

[73] Assignee: Mitsubishi Denki Kabushiki Kaisha, Tokyo, Japan

[21] Appl. No.: 387,168

[22] Filed: Feb. 13, 1995

[51] Int. Cl.$^6$ .............................. H01L 23/28; H01L 21/02
[52] U.S. Cl. .......................... 257/40; 257/787; 257/788; 257/791; 257/642
[58] Field of Search .............................. 257/40, 787, 791, 257/788, 642, 643, 790

[56] References Cited

U.S. PATENT DOCUMENTS

| | | | |
|---|---|---|---|
| 5,023,204 | 1/1991 | Adachi et al. | 437/228 |
| 5,057,336 | 10/1991 | Adachi et al. | 427/44 |
| 5,081,202 | 1/1992 | Adachi et al. | 528/43 |
| 5,180,691 | 1/1993 | Adachi et al. | 437/235 |
| 5,183,846 | 2/1993 | Aiba et al. | 524/865 |
| 5,278,451 | 1/1994 | Adachi et al. | 257/790 |
| 5,306,947 | 4/1994 | Adachi et al. | 257/642 |

FOREIGN PATENT DOCUMENTS

| | | |
|---|---|---|
| 55-50645 | 4/1980 | Japan . |
| 56-118334 | 9/1981 | Japan . |

*Primary Examiner*—Sara W. Crane
*Assistant Examiner*—David B. Hardy
*Attorney, Agent, or Firm*—Sughrue, Mion, Zinn, Macpeak & Seas

[57] ABSTRACT

A semiconductor device having a stress-buffering film which is effective in buffering the stress caused by a molding resin during sealing, the stress-buffering film being made of a silicone ladder resin represented by formula (I)

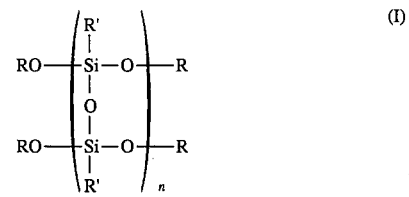

wherein each end group R may be the same or different and represents a hydrogen atom or an alkyl group, each side chain R' may be the same or different and represents a cyclohexyl group, a lower alkyl group, or a photopolymerizable unsaturated group, and n is an integer of 10 or larger.

5 Claims, 7 Drawing Sheets

SEMICONDUCTOR DEVICE COMPRISING A SEMICONDUCTOR SUBSTRATE, AN ELEMENT FORMED THEREON, AND A STRESS-BUFFERING FILM MADE OF A SILICONE LADDER RESIN

FIELD OF THE INVENTION

This present invention relates to an ultraviolet-ray erasion type semiconductor device generally sealed with a molding resin. More specifically, this invention relates to a semiconductor device having a stress-buffering film which is highly effective in buffering the stress caused by a molding resin during sealing.

BACKGROUND OF THE INVENTION

In conventional semiconductor devices sealed with a molding resin, the miniaturization of semiconductor elements has led to the problem of volatilization insufficiency or malfunctions, which problem is caused by the stress of the sealing resin.

To overcome this problem, a technique of covering an element with a stress-buffering film consisting of a resin layer has been proposed. For example, the semiconductor device disclosed in JP-A-55-50645 employs a surface-protective film made of a silicone ladder resin having in side chains both a group which functions to enhance heat resistance, e.g., phenyl or methyl, and a group which forms a crosslink upon heating, e.g., an alkyl group. (The term "JP-A" as used herein means as "unexamined published Japanese patent application.")

FIG. 3 shows sectional views illustrating steps of a process for producing the conventional semiconductor device disclosed in the above reference.

The process for producing this conventional semiconductor device is explained below.

First, a base region 32 and an emitter region 33 are formed on a semiconductor substrate 31 made of silicon, as shown in FIG. 3 (a).

A cyclohexanone solution of a synthetic silicone resin obtained by polymerizing phenyltriethoxysilane with heating is then applied on the resulting structure with a spinner, and the coating is dried to form a silicone ladder resin film 34 as shown in FIG. 3 (b).

Subsequently, a photoresist pattern 35 is formed thereon which has openings for the electrode-mounting part of the semiconductor substrate 31 which serves as a collector region and for the electrode-mounting parts of the base region 32 and the emitter region 33, as shown in FIG. 3 (c).

The silicone ladder resin film 34 is then etched with 1,1,1-trichloroethane using the photoresist pattern 35 as a mask. Thereafter, the photoresist 35 is removed and the resulting structure is heated at 350° C. for 1 hour to form a crosslinked silicone ladder resin pattern 34a as shown in FIG. 3 (d).

Subsequently, a deposited aluminum film 36 is formed so as to fill the openings of the silicone ladder resin pattern 34a as shown in FIG. 3 (e), and a photoresist pattern 35a having a given shape is formed thereon as shown in the figure.

The deposited aluminum film 36 is then etched using the photoresist pattern 35a as a mask to thereby form aluminum electrodes 36a as shown in FIG. 3 (f). Thus, the desired semiconductor device is fabricated.

The MOS transistor according to the above-described conventional technique, which has a film of a silicone ladder resin such as that obtained by polymerizing phenyltriethoxysilane with heating, has proved to have a stable leakage current between the source and drain even after standing in a high-temperature atmosphere.

On the other hand, FIG. 4 is a sectional view illustrating the semiconductor device disclosed in JP-A-56-118334. In the figure, numeral 41 denotes a semiconductor substrate and 44's denote aluminum wiring formed on the semiconductor substrate 41 and an aluminum film serving as an aluminum electrode pad for wire bonding. Further, numeral 45 denotes a PSG film and 46 denotes a surface-protective film made of a polyimide. A feature of this semiconductor device resides in that due to the surface-protective film 46, the device is free from soft errors caused by α-rays, and the PSG film 45 as an undercoat does not suffer cracking even when it has mechanical stress.

In the above-described reference, an alkali solution is used in the etching of the polyimide film for forming the surface-protective layer 46. This etchant, however, corrodes the aluminum surface, which corrosion may result in an aluminum pad having a rough surface. When an Au wire is bonded to this surface-roughened aluminum pad, the surface roughness of the pad results in a defective connection between the aluminum pad and the Au wire, leading to decreased reliability of the semiconductor device.

The surface of the aluminum pad can be prevented from being roughened due to the presence of the PSG film 45. That is, prior to the formation of the polyimide film in fabricating this semiconductor device, the PSG film 45 is formed by the CVD method and the polyimide film formed thereafter is etched to provide openings in the polyimide film. The PSG film 45 disposed over the aluminum pad is thereafter selectively removed by etching with a mixture of HF and $NH_4F$.

Because of the factors described above, however, the conventional semiconductor devices have a problem that when the devices are packaged, the stress caused by the molding resin cannot be buffered.

This is because the attainable thickness of the silicone ladder resin film in one of the conventional devices as described in the aforesaid JP-A-55-50645 is up to 2 μm, so that this film is too thin to function as a stress-buffering film. Such thickness limitation of the silicone ladder resin is attributable to the molecular weight thereof which is not so high.

Hitherto, a silicone ladder resin having, in side chains, both a group which enhances heat resistance (e.g., phenyl or methyl) and a group which forms a crosslink upon heating (e.g., an alkyl group), or a polyimide resin have been employed for the surface-protective film. The higher the heat resistance of the surface-protective film of a semiconductor device, the higher the reliability of the device. The heat resistance of silicone ladder resins varies depending on the kind of the side chains thereof. In the air, the phenylated silicone ladder resins have the highest heat resistance of from 500° to 550° C., and are superior in heat resistance to polyimide resins. In an oxygen-free atmosphere, e.g., in nitrogen, however, the methylated silicone ladder resins have a heat resistance as high as 700° C. In view of the fact that those semiconductor devices are used in such a state that the surface-protective film is sealed with a molding resin, the optimal material of the surface-protective film is a methylated silicone ladder resin. However, it has been difficult to obtain a high-molecular silicone ladder resin having methyl groups in side chains without gelation, so that formation of a thick film has been difficult. That is, the thicknesses of the conventional silicone ladder resins are insufficient for buffering the stress caused by the molding resins.

Another problem of the semiconductor devices, as decribed in the aforesaid JP-A-55-50645, is concerned with the use of 1,1,1-trichloroethane for etching. 1,1,1-trichloroethane not only reacts with water to generate hydrogen chloride, which is corrosive, but also readily decomposes upon exposure to a fire to generate gases including hydrogen chloride. Because of such properties of 1,1,1-trichloroethane, care should be taken in handling the same, and etching with this compound is limited in the materials of the etching apparatus and etching vessels.

On the other hand, polyimides as used in the aforesaid JP-A-56-118334 function as a stress-buffering film, but have a problem of inferiority in heat resistance and stability. Use of a polyimide has another drawback in that a PSG film should be formed and patterned in order to prevent the surface of the aluminum pad from being roughened during etching of the polyimide resin film, making the process complicated.

A further problem of the conventional semiconductor devices is that when the surface-protective film is formed on a UV-ray erasion type semiconductor memory such as an OTPROM, erasion with UV rays is impossible or usable UV rays are limited in wavelength, etc. For example, when a polyimide resin film is employed, UV light is unusable for erasing stored information because polyimide resins do not transmit light having a wavelength of 400 nm or shorter. Use of the silicone ladder resin disclosed in the aforesaid JP-A-55-50645 has a drawback in that the erasion of stored information by UV irradiation is inefficient because of the presence of phenyl groups in side chains of the resin. This is because the silicone ladder resin having phenyl groups has an absorption wavelength region of from 250 to 270 nm, although it transmits light having a wavelength of 290 nm or longer.

SUMMARY OF THE INVENTION

The present invention has been achieved in order to eliminate the problems described above. An object of the present invention is to enhance resistance to the stress caused by resin molding and to heighten the efficiency of UV irradiation.

The present invention provides a semiconductor device which comprises a semiconductor substrate, an element formed thereon, and a stress-buffering film disposed over the semiconductor substrate, said stress-buffering film being made of a silicone ladder resin represented by formula (I)

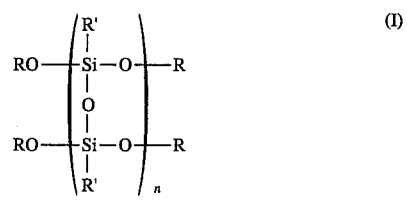

wherein each end group R may be the same or different and represents a hydrogen atom or an alkyl group, each side chain R' may be the same or different and represents a cyclohexyl group, a lower alkyl group, or a photopolymerizable unsaturated group, and n is an integer of 10 or larger.

DETAILED DESCRIPTION OF THE INVENTION

In formula (I), the alkyl group for R preferably has from 1 to 4 carbon atoms, such as methyl, ethyl, propyl, and butyl; and the lower alkyl group for R' preferably has from 1 to 4 carbon atoms, such as methyl, ethyl, propyl, and butyl. However, the number of carbon atoms for R and R' is not limited thereto, and they may have more carbon atoms such as hexyl. Further, the photopolymerizable unsaturated group for R' is not particularly limited but is preferably vinyl or allyl. The photopolymerizable unsaturated group preferably accounts for 3 mol % or more, more preferably from 5 to 100 mol %, of the whole side chain groups R' in the molecule.

The silicone ladder resin represented by formula (I) has good solution stability when n is an integer of 10 to 800. From the standpoint of anti-cracking properties, n is preferably an integer of 50 or larger.

If n is smaller than 10, the silicone is not a resin but an oligomer and shows poor solution stability. If n exceeds 800, the silicone ladder resin tends to have a reduced solubility in solvents.

The silicone ladder resin of formula (I) preferably has a weight average molecular weight of 5,000 or more, more preferably 10,000 or more.

The silicone ladder resin is applied to a semiconductor substrate having an element thereon in the form of solution in an organic solvent such as anisole, followed by heating with or without exposing to light to cure the resin, whereby the stress-bufferring film of the present invention is provided on the substrate.

The semiconductor devices of the present invention have the following effects.

Since the semiconductor devices employ a high-molecular silicone ladder resin represented by formula (I), wherein n is 10 or larger, the stress-buffering film can have a large thickness, preferably from 4 to 10 μm.

Furthermore, since the amount of the unsaturated group contained in the stress-buffering film is not so large, the stress-buffering film is less apt to absorb ultraviolet rays and transmits ultraviolet rays having shorter wavelengths.

In addition, the stress-buffering film can be made to have photosensitivity, so that it can be patterned by photolithography.

The present invention is explained in detail below with reference to the following Examples.

EXAMPLE 1

Figure 1A:
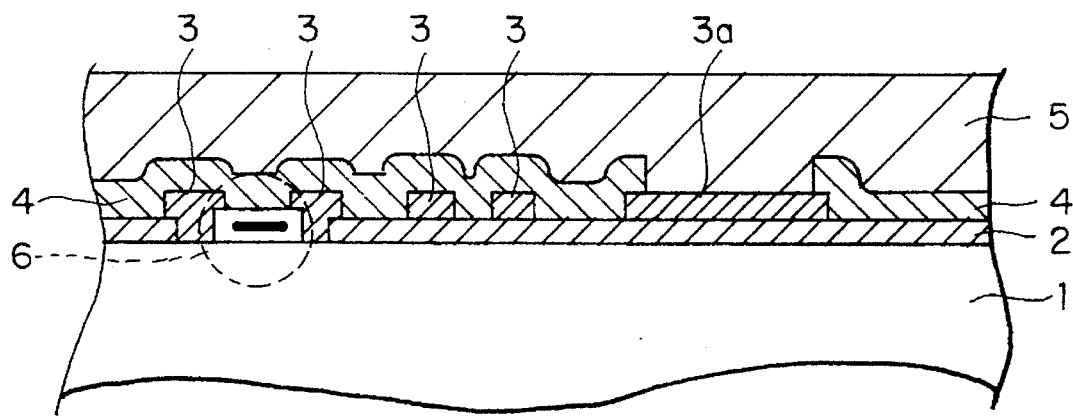
FIGS. 1(a)–1(d) are sectional views illustrating steps of a process for producing a semiconductor device in Example 1 of the present invention.
Figure 1B:
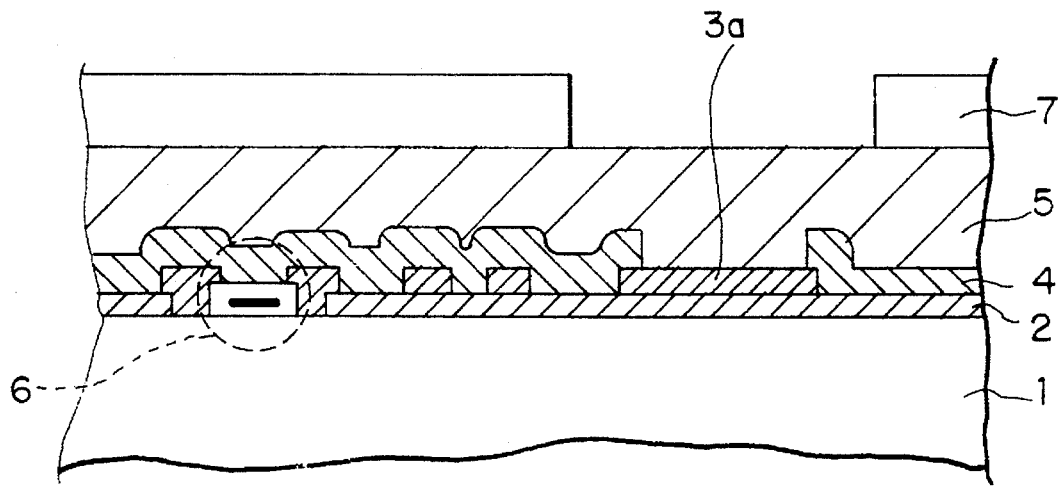
Figure 1C:
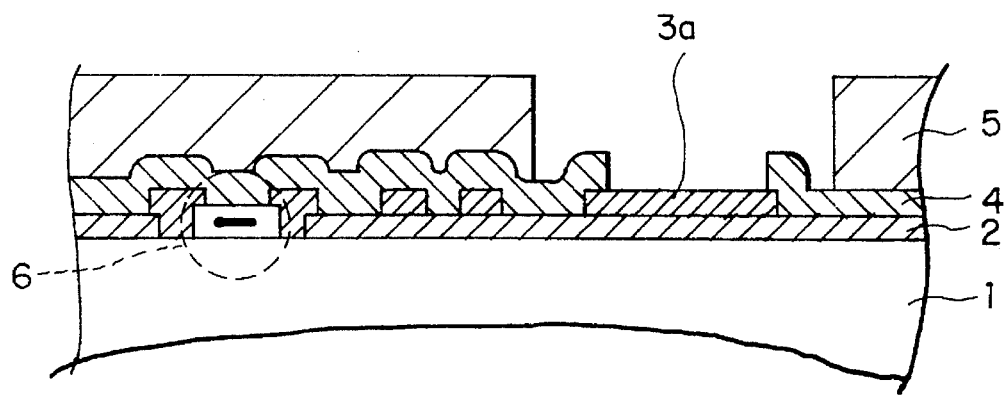
Figure 1D:
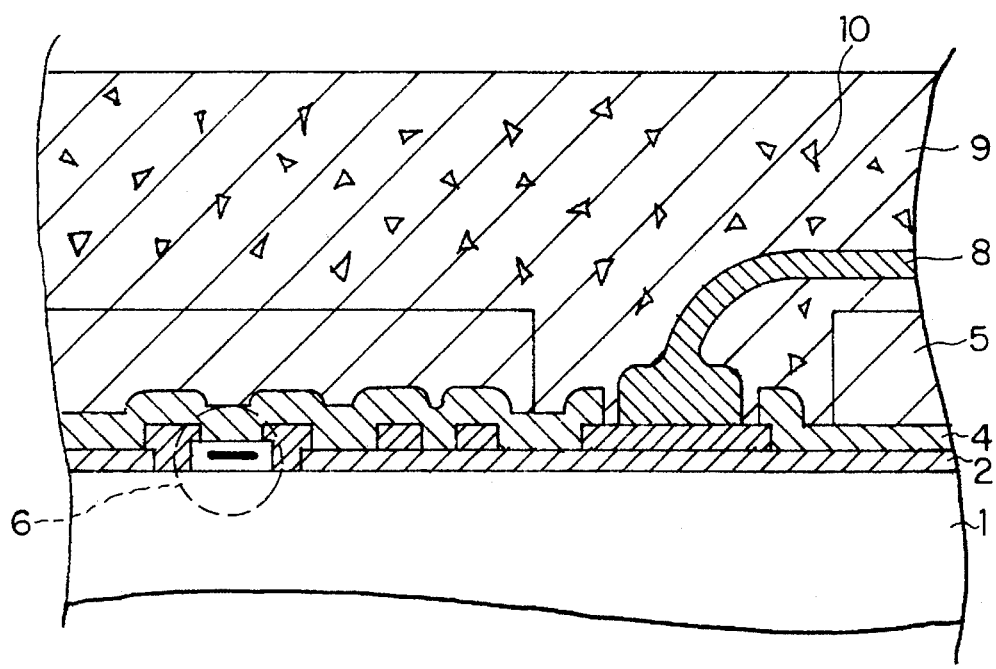

A semiconductor device of the present invention was produced by the steps illustrated in FIG. 1.

In the figure, numeral 1 denotes a semiconductor substrate, 2 an oxide film deposited on the semiconductor substrate 1 by CVD, 3 an aluminum wiring, 3a an aluminum bonding pad, 4 a silicon nitride film, 5 a resin film for stress buffering, which film constitutes the characteristic feature of the present invention, and 6 a transistor formed on the semiconductor substrate 1.

The semiconductor substrate 1 has two or more active elements which have been formed thereon simultaneously, and an enlarged partial sectional view of one of such elements is shown in FIG. 1.

The process for producing the semiconductor device is explained below by reference to FIG. 1.

First, a silicone ladder prepolymer was obtained by the method disclosed in JP-A-6-248083, that is, by dissolving an organotrialkoxysilane represented by the formula $R_4Si(OR_5)(OR_6)(OR_7)$ (wherein $R_4$, $R_5$, $R_6$, and $R_7$ each represents a lower alkyl group) into an organic solvent, hydrolyzing the organotrialkoxysilane with ultrapure water with cooling, and then cleaning the resulting hydrolyzate with ultrapure water.

In this method, the prepolymer can be obtained in a highly purified state because of the use of ultrapure water for, e.g., cleaning the hydrolyzate. It is therefore possible to obtain a polymer having a higher molecular weight.

A nucleophilic reagent was added to an organic solvent solution of the above-obtained silicone ladder prepolymer to condense the prepolymer with elimination of water. Examples of the nucleophilic reagent include hydroxides of K, Na, or Cs, preferably KOH and NaOH. This condensate was purified by the dissolution-reprecipitation method to obtain a silicone ladder resin having methyl groups at the ends and as side chains which resin is represented by formula (II).

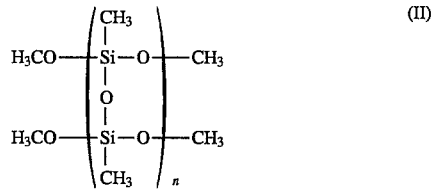

In this Example, the value of n was selected so as to give a weight-average molecular weight of 100,000. An anisole solution of this silicone ladder resin (concentration: about 25% by weight) was applied on a semiconductor substrate 1 by spin coating.

The semiconductor substrate 1 had, formed thereon beforehand, an oxide film 2, an aluminum wiring 3, aluminum bonding pads 3a, a silicon nitride film 4, transistors 6, etc.

The coated structure was allowed to stand in a nitrogen atmosphere first at 80° C. for 30 minutes, subsequently at 150° C. for 30 minutes, and then at 350° C. for 60 minutes. By these heating treatments, the silicone ladder resin applied was cured to form a resin film 5 as shown in FIG. 1 (a) which film had a thickness of 5 μm.

Although the silicone ladder resin has methyl groups as side chains, it can have a high molecular weight because it is produced by the method described above. Hence, this resin can be deposited thickly and, as a result, less tends to develop cracks.

The structure covered with the silicone ladder resin was then spin-coated with a positive type photoresist, and the coated structure was heated in a nitrogen atmosphere at 80° C. for 30 minutes to form a coating film having a thickness of 1.5 μm. A desired pattern was formed in this coating film by lithography and the coating film was then heated at 120° C. for 30 minutes to form a resist pattern 7 as shown in FIG. 1 (b).

Subsequently, the resin film 5 was etched with a reactive gas consisting of $CHF_3$ containing 10 vol % oxygen by the RIE method under conditions of a pressure of 10 Pa, an RF electric power of 400 W, and a treating time of 15 minutes, with the resist pattern 7 as a mask. With respect to the RIE method, reference can be made to J. Electrochem. Soc., Vol. 137, No.4, April, p. 1235–1239 (1990) and ditto, Vol.141, No.2, Feb., p.502–506 (1994).

The resist pattern 7 was then removed with an oxygen plasma using a low damage asher of the type having a plasma generation chamber and a reaction chamber separated from each other (FIG. 1 (c)).

A plasma asher of the parallel-plate type can be also used to remove the resist pattern 7 likewise.

An electrical writing test was then performed, and the stored information resulting from this test was erased by irradiating the whole surface of the semiconductor substrate 1 for 5 minutes with the UV light emitted by a high-pressure mercury lamp.

This semiconductor substrate 1 was then cut so as to separate the elements into respective chips, which were fixed to lead frames (not shown). Each lead frame (not shown) was connected to a bonding pad 3a through a bonding wire 8.

The resulting structure was sealed with a molding resin 9 containing a filler 10 (FIG. 1 (d)).

In this embodiment of Example 1, the resin film 5 made of the silicone ladder resin contains no groups having a carbon-carbon double bond ($>C=C<$), e.g., phenyl.

Unsaturated carbon chains having a carbon-carbon double bond or the like are more instable than saturated carbon chains and tend to come into a stable state. Upon irradiation with UV rays, such unsaturated carbon chains hence undergo a chemical reaction, e.g., polymerization reaction, with the radiation being used as an energy for the reaction. Namely, the unsaturated carbon chains absorb ultraviolet rays.

In this embodiment, however, the resin layer 5 almost entirely transmits UV rays having wavelengths of about 190 nm and longer because of the absence of an UV-absorbing carbon-carbon double bond, resulting in an improved efficiency in UV irradiation.

A semiconductor device package fabricated by the method described above was subjected to a pressure cooker test in which the package was allowed to stand at 120° C. and 2 atom for 1,000 hours.

After this test, the semiconductor device sealed by resin molding was examined for troubles. As a result, the percent defective was 0%.

A heat shock test was also performed in which the sealed semiconductor device was subjected to 500-time thermal cycling, each cycle consisting of 1-minute exposure to −196° C. and 1-minute exposure to +260° C.

In this test also, no trouble occurred in the semiconductor device. The molding resin 9 was removed to examine the inside and, as a result, no abnormality was observed.

As described above, in this semiconductor device of Example 1, the resin film 5 not only was able to buffer the stress of the molding resin 9 used for sealing, but also was effective in preventing the silicon nitride film 4 from developing cracks and the aluminum wiring 3 from undergoing a mechanical change.

In addition, the malfunctioning of the semiconductor device due to the partial stress of the filler 10 could be prevented.

Although the embodiment described above employed a silicone ladder resin in which the end groups were methyl, usable silicone ladder resins are not limited thereto. Other silicone ladder resins produce the same effects as long as the end groups are a lower alkyl group such as ethyl or propyl.

EXAMPLE 2

Although the embodiment described above employed a silicone ladder resin in which the end groups were methyl and the side chains were also methyl, usable silicone ladder resins are not limited thereto. A silicone ladder resin terminated by hydrogen atoms may be also used.

In producing this embodiment of Example 2, a silicone ladder prepolymer was first obtained by the method disclosed in JP-A-6-248083, that is, by dissolving an organotrichlorosilane represented by the formula $R_8SiCl_3$ (wherein $R_8$ represents a lower alkyl group) into an organic solvent, hydrolyzing the organotrichlorosilane with ultrapure water with cooling, and then cleaning the resulting condensate with ultrapure water.

This prepolymer was dissolved into an organic solvent, and a nucleophilic reagent was added to the solution to condense the prepolymer with elimination of water. Thus, a silicone ladder resin was obtained which had hydrogen atoms at the ends and methyl groups as side chains, as represented by formula (III).

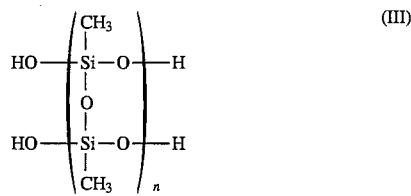

(III)

An anisole solution of this silicone ladder resin regulated to have a resin concentration of about 25% by weight was then prepared. The subsequent procedure was carried out in the same manner as in Example 1, except that the solution thus prepared was used as a coating liquid. Thus, a semiconductor device was produced.

The silicone ladder resin terminated by hydrogen atoms as in Example 2 showed slightly higher adherence to the adherend layers than the methyl-terminated resin used in Example 1 because of the higher OH group content thereof.

Like the resin used in Example 1, the polymer in Example 2 was obtained from a highly purified prepolymer and hence could have a higher molecular weight. Hence, a thick film of the silicone ladder resin could be formed, so that cracking was less apt to occur.

The resin film formed had the same UV transmission as in Example 1. The semiconductor device of Example 2 was equal to that of Example 1 in other properties.

COMPARATIVE EXAMPLE 1

The following test was performed for the purpose of comparison with the semiconductor devices of Examples 1 and 2.

A semiconductor device having no surface-protective layer and a semiconductor device having a 2 μm-thick surface-protective film 5 made of the silicone ladder resin represented by formula (II) or (III) were prepared.

These semiconductor devices were tested under the same conditions as in Example 1, except that the conditions concerning the silicone ladder resin film as a surface-protective film were changed.

These semiconductor devices were examined for percent defective. As a result, the semiconductor device having no silicone ladder resin film had a percent defective of 6%. The semiconductor device having a 2 μm-thick surface-protective film made of the silicone ladder resin film had a percent defective of 3%.

EXAMPLE 3

The resins used in the above Examples had methyl groups as side chains, as shown in formulae (II) and (III), but usable silicone ladder resins are not limited thereto. A resin having cyclohexane as side chains may be used.

In this embodiment of Example 3, a silicone ladder resin represented by formula (II) or (III) wherein the side chain methyl groups have been replaced with cyclohexyl groups was used for formation of a resin film 5 (FIG. 1), and a semiconductor device was produced in the same manner as in Example 1, whereby the resin film 5 having a different composition from that of Example 1 was formed.

This semiconductor device of Example 3 was subjected in the same manner as in Example 1 to a pressure cooker test in which the semiconductor device was allowed to stand at 120° C. and 2 atm for 1,000 hours.

After this test, the resulting semiconductor device was examined for defective stored-information volatilization. As a result, the percent defective was 0%.

A 500-time thermal cycling test was further performed in which each cycle consisted of 1-minute exposure to −196° C. and 1-minute exposure to +260° C.

In this test also, no trouble occurred in the semiconductor device. The molding resin was removed to examine the inside and, as a result, no abnormality was observed. Thus, satisfactory results were obtained as in Example 1.

EXAMPLE 4

The silicone ladder resins used in the above Examples had methyl groups or cyclohexane as side chains, but usable silicone ladder resins are not limited thereto.

A semiconductor device was prepared in the same manner as in Example 1, except for using a silicone ladder resin of formula (II) or (III) but having ethyl groups as side chains. As a result of the same tests as in the above Examples, the semiconductor device exhibited the effects as in the the above Examples.

EXAMPLE 5

The silicone ladder resins used in the above Examples had methyl groups, ethyl groups, or cyclohexane as side chains, but usable silicone ladder resins are not limited thereto. A silicone ladder resin having propyl groups as side chains may be used.

In this embodiment of Example 5, a silicone ladder resin was used which had the same structure as the resin in Example 1 except that the side chain methyl groups in formula (II) or (III) had been replaced with propyl groups.

Unlike the resin film of Example 1, a 5 μm-thick resin film was formed in this Example by heating the silicone ladder resin film in a nitrogen atmosphere first at 80° C. for 30 minutes, subsequently at 150° C. for 30 minutes, and then at 250° C. for 30 minutes.

In contrast to the dry etching conducted in Example 1 for forming openings over bonding pad areas, etc., wet etching of the resin film with a mask pattern of a photoresist formed thereon was performed in this Example using an anisole/ xylene mixture (½ by volume) as an etchant.

The photoresist serving as a mask pattern was removed by a wet treatment with n-butyl acetate. The resulting structure was heated in a nitrogen atmosphere at 350° C. for 60 minutes to form on the substrate the resin film having openings over bonding pad areas.

A semiconductor device was fabricated in the same manner as in Example 1 except the above. After a 1,000-hour pressure cooker test, the resulting semiconductor device was examined for defective stored-information volatilization. As a result, the percent defective was 0%. Further, a heat shock test was performed in which the semiconductor device was subjected to 500-time thermal cycling, each cycle consisting of 1-minute exposure to −196° C. and 1-minute exposure to +260° C. As a result, no transistor trouble occurred.

The molding resin was removed to examine the inside. As a result, no abnormality was observed. Thus, satisfactory results were obtained as in Example 1.

Although an organic solvent was used for etching the silicone ladder resin in this Example, dry etching may also be used as in Examples 1 to 4.

In contrast, an organic solvent may be used for etching in Examples 1 to 4.

EXAMPLE 6

Figure 2A:
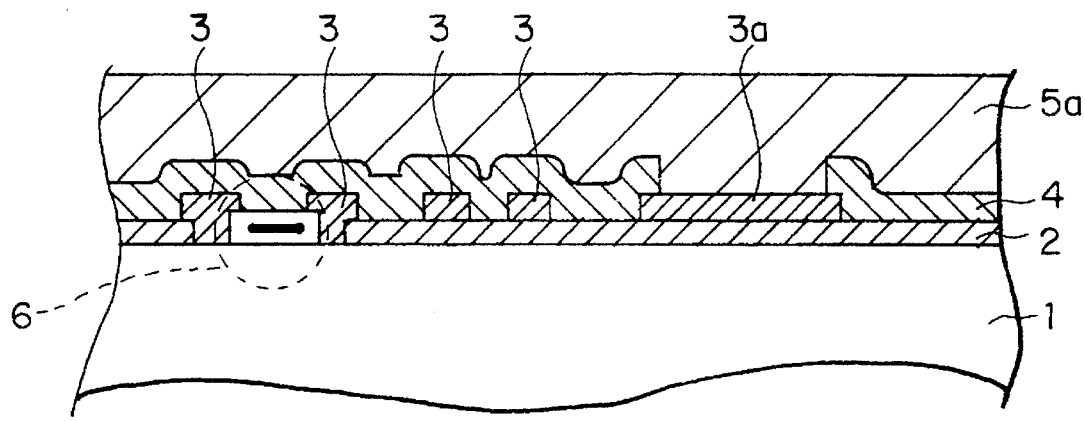
FIGS. 2(a)–2(d) are sectional views illustrating steps of another process for producing a semiconductor device in Example 6 of the present invention.
Figure 2B:
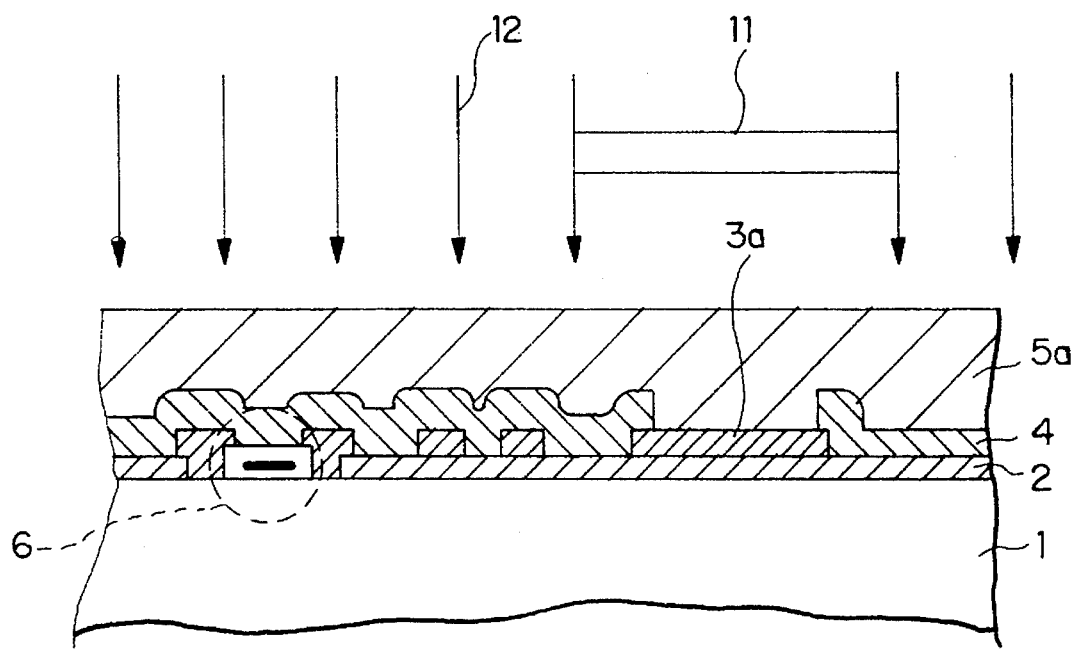
Figure 2C:
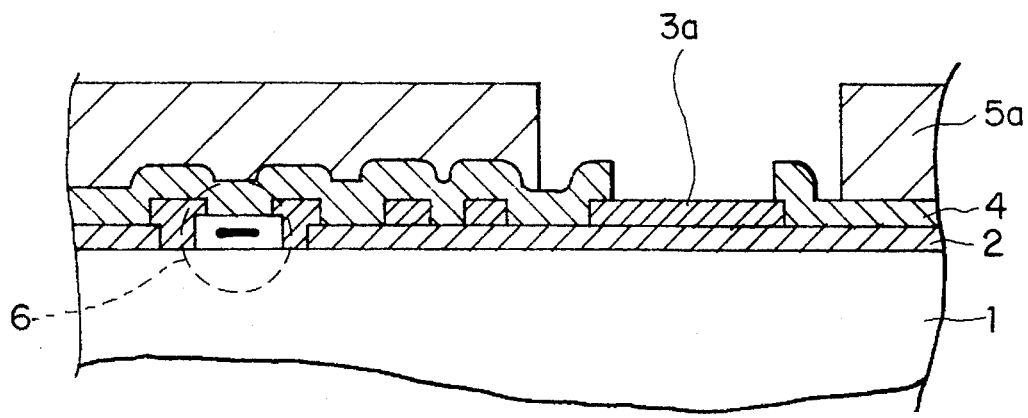
Figure 2D:
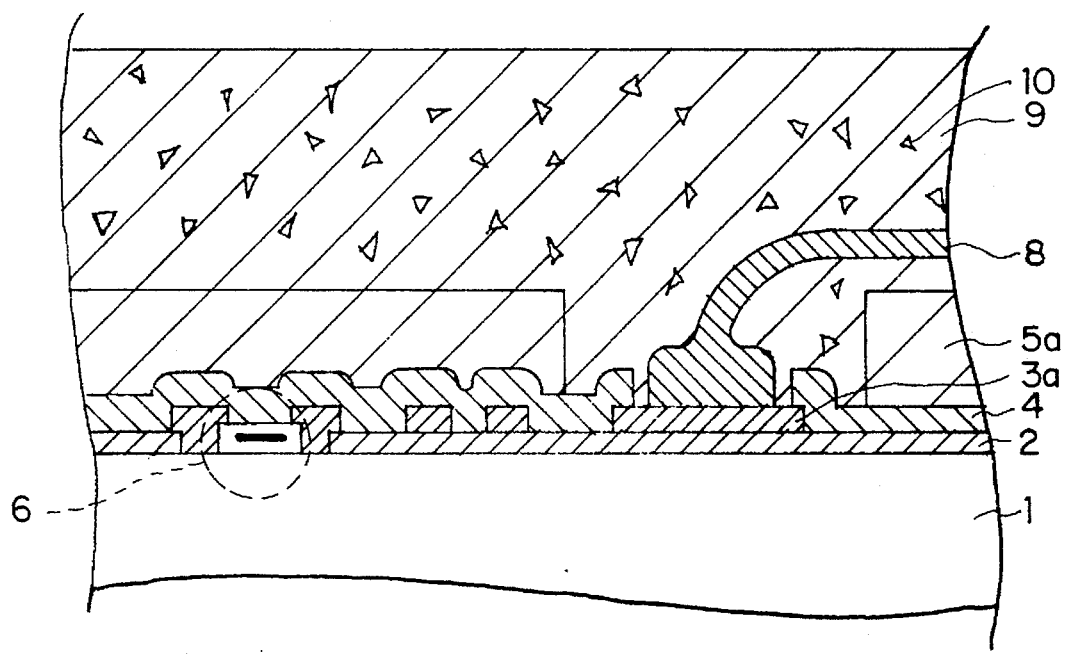
Figure 3A:
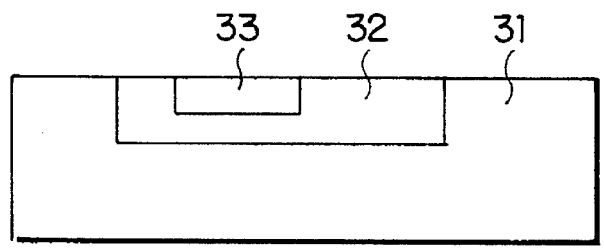
FIGS. 3(a)–3(f) are sectional views illustrating steps of a process for producing a conventional semiconductor device.
Figure 3B:
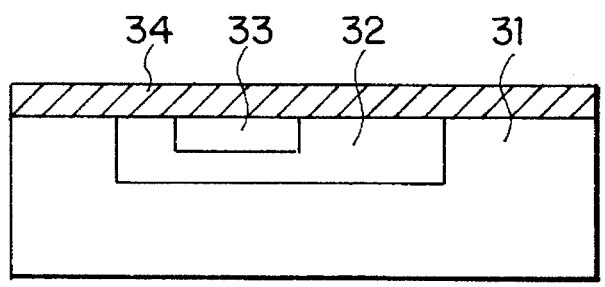
Figure 3C:
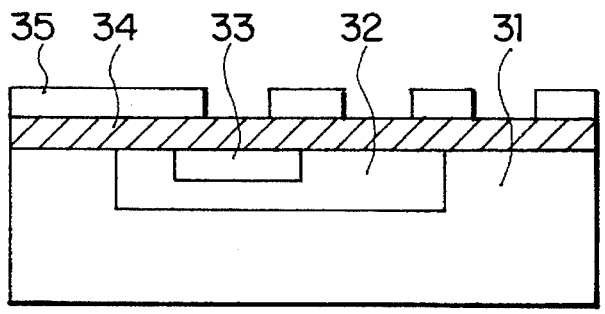
Figure 3D:
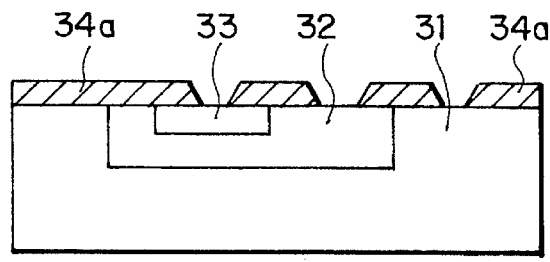
Figure 3E:
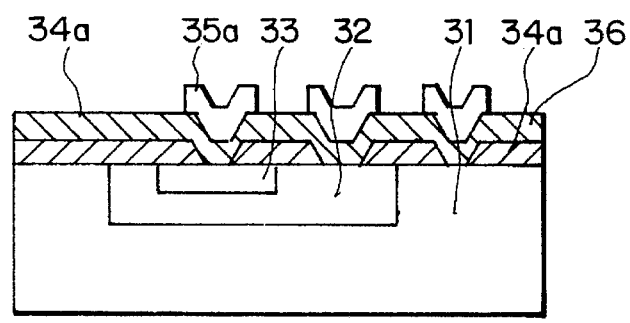
Figure 3F:
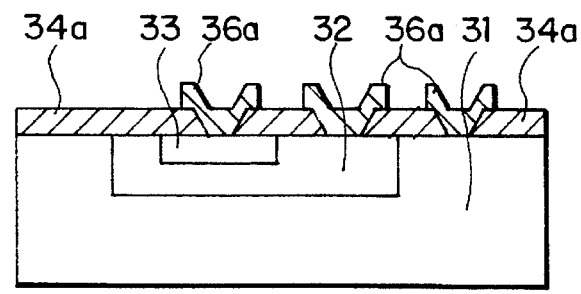
Figure 4:
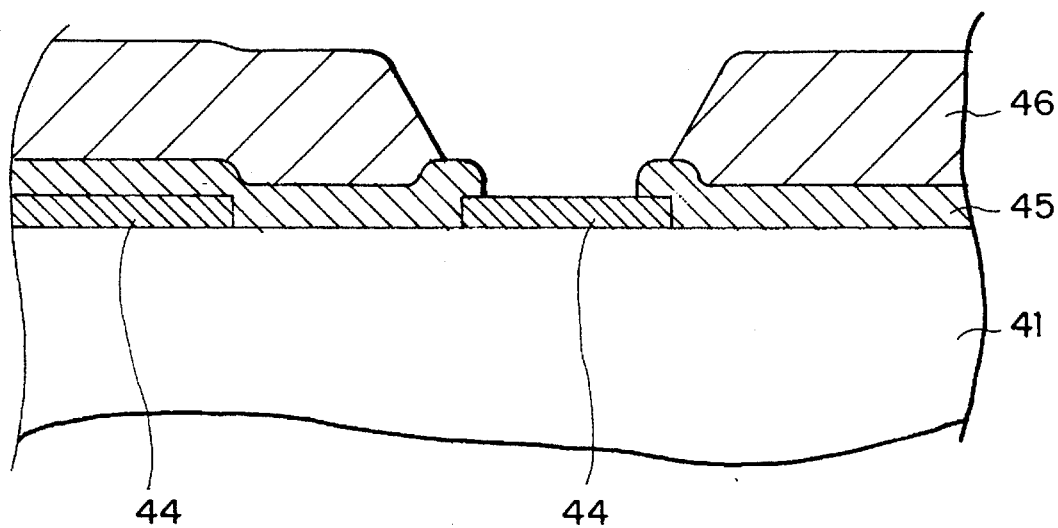
FIG. 4 is a sectional view illustrating another conventional semiconductor device.

FIG. 2 shows sectional views illustrating steps of another process for producing a semiconductor device of the present invention.

In this embodiment is used a silicone ladder resin which contained hydrogen atoms at the ends and contains methyl side chains and allyl (—$CH_2CH_2$=$CH_2$) side chains, that are photopolymerizable, and which had a weight-average molecular weight of 100,000. The proportion of the photopolymerizable groups to the methyl groups was 5 mol %.

This silicone ladder resin, in which photopolymerizable groups have been incorporated, can be obtained by dissolving methyltrichlorosilane and 5 mol %, based on the amount of the methyltrichlorosilane, of allyltrichlorosilane into an organic solvent, dropwise adding ultrapure water to the solution with cooling to co-hydrolyze the silane compounds, subsequently cleaning the hydrolyzate with ultrapure water, adding a nucleophilic reagent to an organic solvent solution of the cleaned hydrolyzate, heating the resulting mixture to condense the hydrolyzate with elimination of water, and then purifying the condensate by the dissolution-reprecipitation method. The organic solvent used in the above-described preparation may be ketones such as methyl isobutyl ketone, ethers, aromatic hydrocarbons, or a mixture thereof.

The process for producing the semiconductor device of this Example is explained below by reference to FIG. 2.

A semiconductor substrate 1 having, formed thereon beforehand, an oxide film 2, an aluminum wiring 3, aluminum bonding pads 3a, a silicon nitride film 4, etc. was spincoated with an anisole solution of both the silicone ladder resin obtained above and 1%, based on the amount of the silicone ladder resin, of 2,6-di(4'-azidobenzal)cyclohexanone (the solution being regulated to have a concentration of about 25% by weight).

The coated structure was pre-baked in an 80° C. nitrogen atmosphere for 30 minutes to form a silicone ladder resin film 5a having a thickness of about 5 μm (FIG. 2 (a)).

This resin film 5a was then irradiated for 60 seconds with UV rays 12 (high-pressure mercury lamp, 500 W) through a mask 11 having a given pattern (FIG. 2 (b)).

The resulting resin film 5a was developed with anisole to form openings over the bonding pads 3a. This structure was heated at 350° C. for 60 minutes to completely cure the resin film 5a (FIG. 2 (c)).

The subsequent procedure was carried out in the same manner as in Example 1 to obtain a semiconductor device sealed with a molding resin 9 (FIG. 2 (d)).

As described above, in this embodiment of Example 6, the resin film 5a serves as a photoresist. Further, any substance which corrodes metals is not used in the development for forming the photoresist.

Therefore, the step of forming a master pattern for etching, the step of etching using the master pattern, the step of removing this master pattern, etc., which steps were conducted in Example 1, can be omitted. Accordingly, the process can be shortened. In addition, the surfaces of the bonding pads are prevented from being roughened.

The semiconductor device fabricated by the method described above was subjected to a 1,000-hour pressure cooker test under conditions of 120° C. and 2 atm. Thereafter, the device was examined for transistor troubles. As a result, the percent defective was 0%.

Further, a heat shock test was performed in which the semiconductor device was subjected to 500-time thermal cycling, each cycle consisting of 1-minute exposure to −196° C. and 1-minute exposure to +260° C. As a result, no transistor trouble occurred in this test also.

The molding resin was removed to examine the inside and, as a result, no abnormality was observed. Thus, satisfactory results were obtained as in Example 1.

As described above, in the semiconductor device shown in FIG. 2, not only the stress of the molding resin 9 could be buffered, but also the cracking of the silicon nitride film 4 and the mechanical deformation of the aluminum wiring 3 could be prevented.

In addition, transistor malfunctioning due to the partial stress of the filler 10 could be prevented.

COMPARATIVE EXAMPLE 2

The following test was performed for the purpose of comparison with the semiconductor devices of the Examples given above.

A polyimide resin was used as a stress-buffering protective film in place of a silicone ladder resin.

Openings were formed over bonding pad areas not by dry etching but by wet etching using hydrazine. The conditions other than the above were the same as in Example 1.

This semiconductor device of Comparative Example 2 was subjected to an electrical writing test, and the whole surface of the semiconductor substrate was then irradiated with UV rays for 5 hours using a high-pressure mercury lamp. However, it was impossible to completely erase the stored information.

Furthermore, since the bonding pad surfaces were exposed to hydrazine during the formation of openings over the bonding pad areas, the pad surfaces were roughened. Because of this, some of the bonding pads had a defective connection with bonding wires.

COMPARATIVE EXAMPLE 3

For the purpose of comparison with the semiconductor devices of the Examples given above, a semiconductor device employing the silicone ladder resin specified below was fabricated and examined.

The silicone ladder resin used in Comparative Example 3 was characterized in that the side chains in formula (II) or (III) were phenyl.

The semiconductor device employing this silicone ladder resin was subjected to an electrical writing test, and the whole surface of the semiconductor substrate was then irradiated to UV rays for 5 minutes using a high-pressure mercury lamp. However, only 10% of the stored information could be erased.

Further, the complete erasion of the stored information was attempted by conducting 60-minutes irradiation. As a result, the resin film of the silicone ladder resin slightly yellowed.

This yellowing may be attributable to the fact that the phenyl groups contained in the silicone ladder resin film have an absorption wavelength region of from 250 to 270 nm. Namely, the phenyl groups contained in the silicone ladder resin film underwent a change upon absorption of UV rays having a wavelength of from 250 to 270 nm, resulting in the color change.

Because of the above, the efficiency of UV irradiation decreased and the erasion of stored information took much time.

This semiconductor device of Comparative Example 3 was sealed with a molding resin, and then subjected to a pressure cooker test and a heat shock test in the same manner as in the Examples given above. As a result, abnormalities such as memory troubles were not observed.

This semiconductor device of Comparative Example 3 was found to be more costly than the device of Example 1 because of the necessity of a longer time for the erasion of stored information by UV irradiation.

Although a positive type photoresist was used in Examples 1 to 4, usable photoresists are not limited thereto. Use of a negative type photoresist produces the same effects.

Moreover, the silicone ladder resin was cured by heat treatment before being subjected to dry etching in Examples given above, but usable processes are not limited thereto. Heat-curing after dry etching produces the same effects.

In Example 6 given above, allyl groups were used as a photopolymerizable group. However, usable photopolymerizable groups are not limited thereto, and use of other photopolymerizable unsaturated groups such as vinyl produces the same effects.

As described above, the present invention brings about the following effects. Since a high-molecular silicone ladder resin represented by formula (I), wherein each end group R represents an alkyl group, each side chain R' represents a cyclohexane group, a lower alkyl group or a photopolymerizable unsaturated group, and n is an integer of 10 or larger, is used as the material of a stress-buffering film, this stress-buffering film can have a large thickness. The thick stress-buffering film is effective in buffering the stress imposed on the semiconductor device. As a result, improved reliability is obtained.

Furthermore, since the silicone ladder resin does not contain a large amount of a group having a carbon-carbon double bond (>C=C<), e.g., phenyl, the resin shows only slight absorption of UV rays and almost entirely transmits UV rays having wavelengths of about 190 nm and longer.

As a result, an improved efficiency of UV irradiation is obtained. This produces an effect that in semiconductor devices of the UV-ray erasion type, the erasion of stored information can be carried out effectively.

In the case of the semiconductor device in which the stress-buffering film is formed from a silicone ladder resin having a photopolymerizable unsaturated group in side chains, this stress-buffering film can be directly patterned by photolithography.

The semiconductor device of the above type therefore has an effect that the step of forming a master pattern for etching, the step of etching using the master pattern, the step of removing this master pattern, etc. can be omitted, so that the process for forming the stress-buffering film can be shortened.

Processes for semiconductor device production involve a step for polishing the back-side surface of the substrate prior to substrate cutting. A further effect brought about by the present invention is that the stress imposed during this polishing step on the elements disposed on the substrate surface can also be buffered. In the case of semiconductor devices with no surface protection unlike the semiconductor device of this invention, the yield in this step for substrate back polishing is as low as 95%.

While the invention has been described in detail and with reference to specific embodiments thereof, it will be apparent to one skilled in the art that various changes and modifications can be made therein without departing from the spirit and scope thereof.

What is claimed is:

1. A semiconductor device comprising a semiconductor substrate, an element formed thereon, and a stress-buffering film disposed over the semiconductor substrate, said stress-buffering film being made of a silicone ladder resin represented by formula (I)

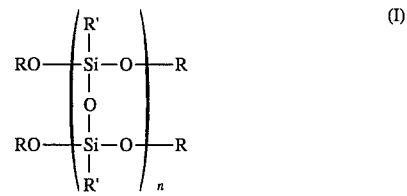

wherein an end group R represents at least one member selected from the group consisting of a hydrogen atom and an alkyl group, a side chain R' represents at least one member selected from the group consisting of a cyclohexyl group, a lower alkyl group, and a photopolymerizable unsaturated group, and n is an integer of at least 10, wherein said silicone ladder resin has said photopolymerizable unsaturated group as R' in the side chains in an amount of at least 3 mol % based on the total amount of whole side chain groups in the molecule, with the proviso that when 100 mol % of said whole side chain groups R' in the molecule are said photopolymerizable unsaturated group, R' cannot be said cyclohexyl group or said lower alkyl group.

2. The semiconductor device as claimed in claim 1, wherein said each end group R represents said alkyl group.

3. The semiconductor device as claimed in claim 1, wherein said each end group R represents said hydrogen atom.

4. The semiconductor device as claimed in claim 1, wherein said silicone ladder resin has said photopolymerizable unsaturated group as R' in the side chains in an amount of at least 5 mol % based on the total amount of the whole side chain groups R' in the molecule.

5. The semiconductor device as claimed in claim 1, wherein said silicone ladder resin has said photopolymerizable unsaturated group as R' in the side chains in an amount of 5 to 100 mol % based on the total amount of the whole side chain groups R' in the molecule.

* * * * *